(12) United States Patent
Zhang (10) Patent No.: US 11,862,286 B2
(45) Date of Patent: Jan. 2, 2024

(54) DATA TRANSMISSION CIRCUIT AND METHOD, AND STORAGE APPARATUS

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 17/649,068

(22) Filed: Jan. 27, 2022

(65) Prior Publication Data

US 2022/0310139 A1    Sep. 29, 2022

Related U.S. Application Data

(63) Continuation of application No. PCT/CN2021/108597, filed on Jul. 27, 2021.

(30) Foreign Application Priority Data

Mar. 26, 2021 (CN) .......................... 202110328177.4

(51) Int. Cl.
*G11C 7/10* (2006.01)
*G11C 11/413* (2006.01)

(52) U.S. Cl.
CPC .......... *G11C 7/1057* (2013.01); *G11C 7/1069* (2013.01); *G11C 7/1084* (2013.01); *G11C 7/1096* (2013.01); *G11C 11/413* (2013.01)

(58) Field of Classification Search
CPC ... G11C 7/1057; G11C 7/1069; G11C 7/1084; G11C 7/1096
See application file for complete search history.

(56) References Cited

U.S. PATENT DOCUMENTS

| | | | | |
|---|---|---|---|---|
| 7,139,852 B2* | 11/2006 | LaBerge | ............. | G06F 13/4243 365/233.17 |
| 2009/0276688 A1* | 11/2009 | Yoshida | ................ | H03M 13/09 714/699 |
| 2010/0058104 A1* | 3/2010 | Ishikawa | ................... | H04L 7/02 713/600 |
| 2016/0225417 A1* | 8/2016 | Lim | ......................... | G11C 7/18 |
| 2018/0277204 A1* | 9/2018 | Takada | ............... | G11C 13/0033 |
| 2021/0098057 A1* | 4/2021 | Jung | ....................... | G11C 29/32 |

* cited by examiner

*Primary Examiner* — Donald H B Braswell
(74) *Attorney, Agent, or Firm* — Syncoda LLC; Feng Ma (57) ABSTRACT

A data transmission circuit includes: a comparison circuit, configured to compare received first data on a data bus with received second data on a global data line and output a comparison result of whether a number of different bits between the first data and the second data exceeds a preset threshold; a data conversion circuit, configured to: if the comparison result indicates that the number of different bits exceeds the preset threshold, invert the first data and transmit the inverted first data to the global data line, and otherwise, transmit the first data to the global data line; and a read-write conversion circuit, configured to: if the comparison result indicates that the number of different bits exceeds the preset threshold, transmit data on the global data line to a complementary local data line, and otherwise, transmit data on the global data line to a local data line.

18 Claims, 9 Drawing Sheets

DATA TRANSMISSION CIRCUIT AND METHOD, AND STORAGE APPARATUS

CROSS-REFERENCE TO RELATED APPLICATIONS

This is a continuation of International Application No. PCT/CN2021/108597 filed on Jul. 27, 2021, which claims priority to Chinese patent application No. 202110328177.4 filed on Mar. 26, 2021. The disclosures of the above-referenced applications are hereby incorporated by reference in their entirety.

BACKGROUND

With rapid developments of semiconductor technologies, the market has more and more requirements for the storage capability and power saving performance of a semiconductor storage apparatus, which imposes higher requirements on the power saving performances of an external circuit region and a storage array region of a control circuit for controlling read and write in the semiconductor storage apparatus.

SUMMARY

The present disclosure relates to the field of semiconductor storage technologies, and in particular, to a data transmission circuit and method, and a storage apparatus.

In a first aspect of the present disclosure, a data transmission circuit is provided. The data transmission circuit includes a comparison circuit, a data conversion circuit, and a read-write conversion circuit. The comparison circuit is configured to receive first data on a data bus and second data on a global data line, and compare the first data with the second data to output a comparison result of whether a number of different bits between the first data and the second data exceeds a preset threshold, where the first data and the second data have a same preset bit width. The data conversion circuit is electrically connected to the data bus, the comparison circuit and the global data line, and is configured to: invert the first data and transmit the inverted first data to the global data line in response to the comparison result indicating that the number of different bits exceeds the preset threshold, and transmit the first data to the global data line in response to the comparison result indicating that the number of different bits does not exceed the preset threshold. The read-write conversion circuit is electrically connected to the global data line, a local data line and a complementary local data line, and is configured to: transmit data on the global data line to the complementary local data line in response to the comparison result indicating that the number of different bits exceeds the preset threshold, and transmit data on the global data line to the local data line in response to the comparison result indicating that the number of different bits does not exceed the preset threshold.

In a second aspect of the present disclosure, a storage apparatus is provided. The storage apparatus includes the data transmission circuit in the first aspect, configured to store and transmit data during a read operation or a write operation.

In a third aspect of the present disclosure, a data transmission method is provided. The data transmission method includes the following operations. First data on a data bus and second data on a global data line are compared, and a comparison result of whether a number of different bits between the first data and the second data exceeds a preset threshold is output, where the first data and the second data have a same preset bit width. In response to the comparison result indicating that the number of different bits exceeds the preset threshold, the first data is inverted and the inverted first data is transmitted to the global data line; and in response to the comparison result indicating that the number of different bits does not exceed the preset threshold, the first data is transmitted to the global data line. In response to the comparison result indicating that the number of different bits exceeds the preset threshold, data on the global data line is transmitted to a complementary local data line; and in response to the comparison result indicating that the number of different bits does not exceed the preset threshold, data on the global data line is transmitted to a local data line, where the local data line transmits a signal having a phase which is opposite to a phase of a signal transmitted by the complementary local data line.

Details of various embodiments of the present disclosure are provided in the accompanying drawings and descriptions below. According to the recitations of the description, accompanying drawings and claims, a person skilled in the art would readily understand other features, a solved problem and a technical effect of the present disclosure.

BRIEF DESCRIPTION OF THE DRAWINGS

To explain the technical solutions in the embodiments of the present disclosure or the related techniques more clearly, the accompanying drawings required to be used in the descriptions of the embodiments or the related techniques are simply introduced below. Apparently, the accompanying drawings in the descriptions below are merely some embodiments of the present disclosure. To better describe and explain the embodiments of the present disclosure, references are made to one or more drawings. However, additional details or examples for describing the accompanying drawings should not be considered as the limitation to the scope of any one of the invention creation of the present disclosure, currently described embodiments or preferable modes.

DETAILED DESCRIPTION

To facilitate the understanding of the present disclosure, the present disclosure would be described more comprehensively with reference to the related accompanying drawings. The preferred embodiments of the present disclosure are provided in the accompanying drawings. However, the present disclosure can be implemented through many different forms, which are not limited in the embodiments described herein. On the contrary, the purpose for providing the embodiments is to make the disclosed contents of the present disclosure more thorough and comprehensive.

Unless otherwise defined, all techniques and scientific terms used herein have the same meanings as those generally understood by a person skilled in the technical field of the present disclosure. The terms used in the description of the present disclosure are only used for the purpose of describing specific embodiments, rather than the purpose of limiting the present disclosure. In addition, some terms used through the description and the accompanying claims refer to specific components. A person skilled in the art would understand that a manufacturer may use different names for indicating a component. The present disclosure does not intend to distinguish components with different names but the same function. In the following descriptions and embodiments, terms "comprising" and "including" are both used in an open type, and therefore, should be interpreted as "comprising, but not limited to . . . ". Similarly, the term "connecting" desires to express an indirect or direct electrical connection. Accordingly, if a device is connected to another device, connection may be completed through the direction electrical connection, or may be completed through the indirect electrical connection between other devices and a connection member.

It should be understood that the terms "first", "second" and the like may be used for describing various components herein. However, these components should not be limited by these terms. These terms are merely used for distinguishing one component from another component. For example, without departing from the scope of the present disclosure, a first component may be referred to as a second component, and similarly, the second component may be referred to as the first component.

Due to the increasing of the density and number of storage cells in an storage cell array, in the process of writing data into the semiconductor storage apparatus, when data is written into a data bus through a data terminal and is transmitted to a rear-stage data line, the length of the data transmission path through which the data passes is increased, which results in that the power consumption is increased and the data transmission rate is reduced in the process of transmitting the written data to a local data line through the data terminal.

If the energy consumption in the process of transmitting the written data to the local data line through the data terminal can be reduced in a case of ensuring that the density and number of the storage cells in the storage cell array are not reduced, this will increase the possibility of further improving the storage capability of the semiconductor storage apparatus and reducing the energy consumption of the semiconductor storage apparatus.

Figure 1:
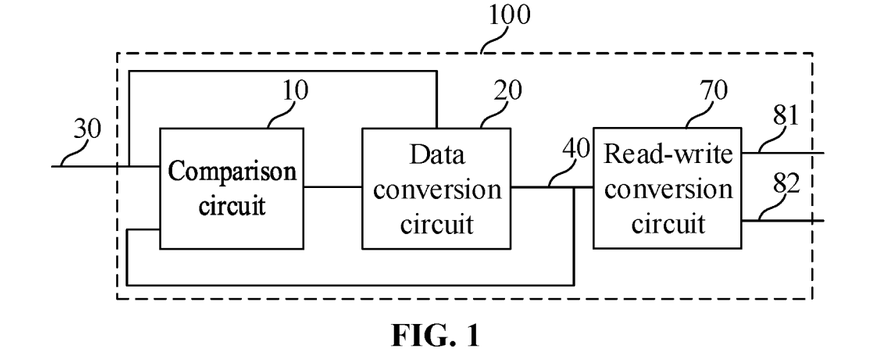
FIG. 1 is a schematic diagram of a principle of a data transmission circuit provided by a first embodiment of the present disclosure.

With reference to FIG. 1, an embodiment of the present disclosure provides a data transmission circuit 100, which includes a comparison circuit 10, a data conversion circuit 20, and a read-write conversion circuit 70. The comparison circuit 10 is configured to receive first data on a data bus 30 and second data on a global data line 40, and compare the first data with the second data to output a comparison result of whether a number of different bits between the first data and the second data exceeds a preset threshold, where the first data and the second data have a same preset bit width. The data conversion circuit 20 is electrically connected to the data bus 30, the comparison circuit 10 and the global data line 40, and is configured to: in a case that the comparison result indicates that the number of different bits exceeds the preset threshold, invert the first data and transmit the inverted first data to the global data line 40; and in a case that the comparison result indicates that the number of different bits does not exceed the preset threshold, transmit the first data to the global data line 40. The read-write conversion circuit 70 is electrically connected to the global data line 40, a local data line 81 and a complementary local data line 82, and is configured to: in a case that the comparison result indicates that the number of different bits exceeds the preset threshold, transmit data on the global data line 40 to the complementary local data line 82; and in a case that the comparison result indicates that the number of different bits does not exceed the preset threshold, transmit data on the global data line 40 to the local data line 81.

In an embodiment, the local data line 81 transmits a signal having a phase which is opposite to a phase of a signal transmitted by the complementary local data line 82.

As an example, with continued reference to FIG. 1, the comparison circuit 10 is configured to receive the first data on the data bus 30 and the second data on the global data line 40, and compare the first data with the second data to output the comparison result of whether the number of different bits between the first data and the second data exceeds the preset threshold, where the first data and the second data have the same preset bit width, so that the data conversion circuit 20 inverts the first data and transmits the inverted first data to the global data line 40 in a case that the comparison result indicates that the number of different bits exceeds the preset threshold, and transmits the first data to the global data line 40 in a case that the comparison result indicates that the number of different bits does not exceed the preset threshold. Under the premise that the accuracy of the data transmission is ensured, the number of inversions of the data during the data transmission through the data bus 30, the global data line 40 and the local data line 81, or through the data bus 30, the global data line 40 and the complementary local data line 82 are reduced, so as to effectively reduce the power consumption during the data transmission through the data bus 30, the global data line 40 and the local data line 81, or through the data bus 30, the global data line 40 and the complementary local data line 82. Thus, the energy consumption of the semiconductor storage apparatus 200 is reduced in a case of ensuring that the density and number of the storage cells in the storage cell array are not reduced. Since the data transmitted by the local data line 81 and the complementary local data line 82 can be used as references to each other, the accuracy of data transmission to the rear-stage circuit is improved while the efficiency of the data transmission is ensured.

It should be noted that the data bus 30 in the embodiments of the present disclosure is intended to schematically illustrate a front-stage data line of the global data line 40 in the process of writing data into the semiconductor storage apparatus, and is not used as the limitation to the present disclosure.

Furthermore, with continued reference to FIG. 1, in an embodiment of the present disclosure, the read-write conversion circuit 70 is configured to: pull down the local data line 81 to a low level when the global data line 40 is at a high level in a case that the comparison result indicates that the number of different bits exceeds the preset threshold; and pull down the complementary local data line 82 to the low level when the global data line 40 is at the high level in a case that the comparison result indicates that the number of different bits does not exceed the preset threshold.

As an example, with continued reference to FIG. 1, the read-write conversion circuit 70 is configured to: pull down the local data line 81 to the low level when the global data line 40 is at the high level in a case that the comparison result output by the comparison circuit 10 indicates that the number of different bits exceeds the preset threshold; and pull down the complementary local data line 82 to the low level when the global data line 40 is at the high level in a case that the comparison result indicates that the number of different bits does not exceed the preset threshold. It is convenient for the read-write conversion circuit 70 to transmit the data on the global data line 40 to the complementary local data line 82 in a case that the comparison result indicates that the number of different bits exceeds the preset threshold, and transmit the data on the global data line 40 to the local data line 81 in a case that the comparison result indicates that the number of different bits does not exceed the preset threshold, so that the data on the data bus 30 can be accurately transmitted to the local data line 81 or the complementary local data line 82 and the number of inversions of the data during the data transmission can be reduced, so as to effectively reduce the power consumption during the data transmission through the data bus 30, the global data line 40 and the local data line 81, or through the data bus 30, the global data line 40 and the complementary local data line 82.

Figure 2:
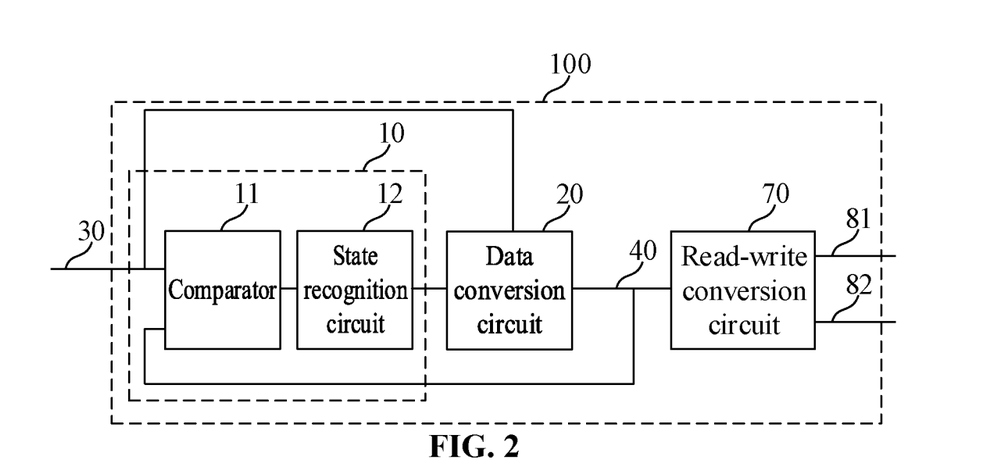
FIG. 2 is a schematic diagram of a principle of a data transmission circuit provided by a second embodiment of the present disclosure.

Furthermore, with reference to FIG. 2, in an embodiment of the present disclosure, the preset threshold is half of the preset bit width; and the comparison circuit 10 includes a comparator 11 and a state recognition circuit 12. The comparator 11 is configured to compare the first data with the second data bit by bit and output comparison state data of respective bits. The state recognition circuit 12 is electrically connected to the comparator 11 and is configured to perform statistics on the comparison state data of the respective bits and output the comparison result according to a statistical result. In this embodiment, the number of inversions of the data is reduced under the premise that the accuracy of the data transmission is ensured, so as to effectively reduce the power consumption during the data transmission.

Figure 3A:
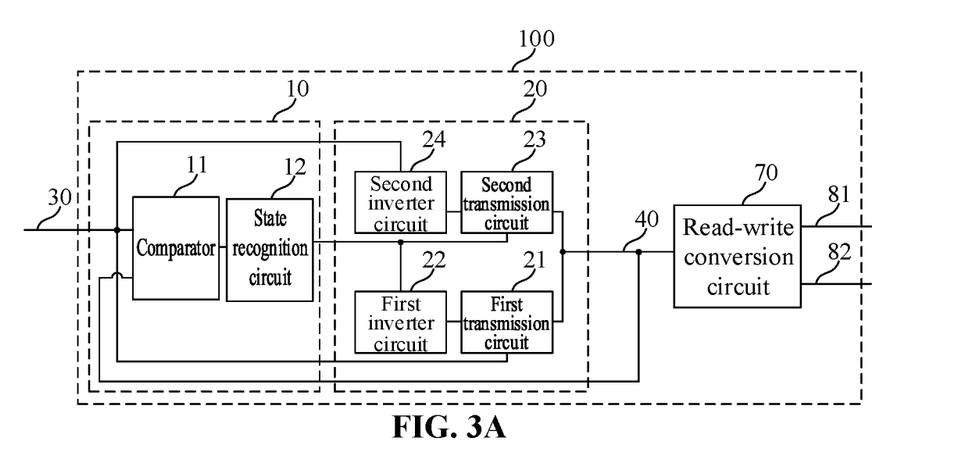
FIG. 3A is a schematic diagram of a principle of a data transmission circuit provided by a third embodiment of the present disclosure.
Figure 3B:
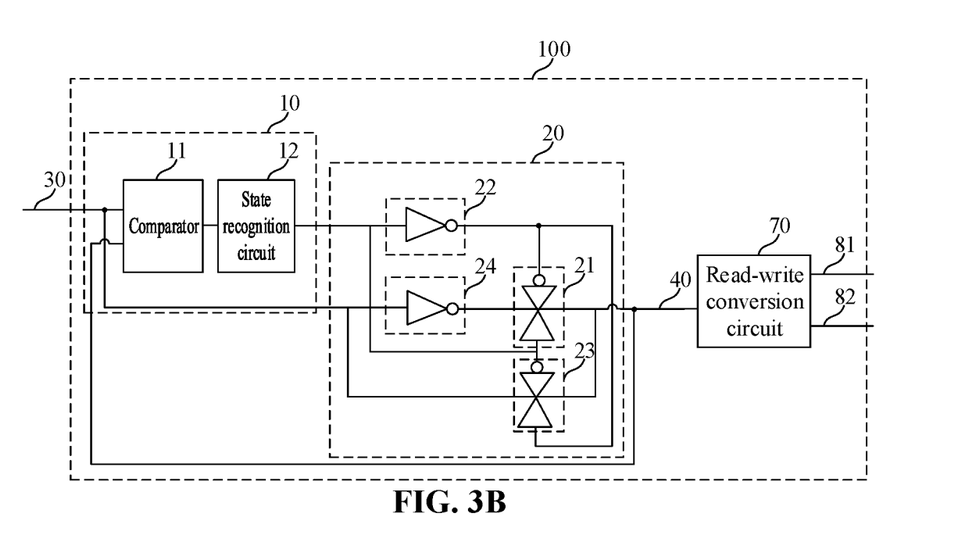
FIG. 3B is a schematic diagram of an implementation of FIG. 3A.

As an example, with reference to FIG. 3A and FIG. 3B, in an embodiment of the present disclosure, the data conversion circuit 20 includes a first transmission circuit 21, a first inverter circuit 22, a second transmission circuit 23, and a second inverter circuit 24. The first transmission circuit 21 is electrically connected to the data bus 30 and the global data line 40 and is electrically connected to an output terminal of the state recognition circuit 12 through the first inverter circuit 22, and is configured to transmit the first data to the global data line 40 in a case that the comparison result output by the comparison circuit 10 indicates that the number of different bits does not exceed the preset threshold. The second transmission circuit 23 is electrically connected to the global data line 40 and the output terminal of the state recognition circuit 12 and is electrically connected to the data bus 30 through the second inverter circuit 24, and is configured to invert the first data and transmit the inverted first data to the global data line 40 in a case that the comparison result output by the comparison circuit 10 indicates that the number of different bits exceeds the preset threshold.

Figure 4:
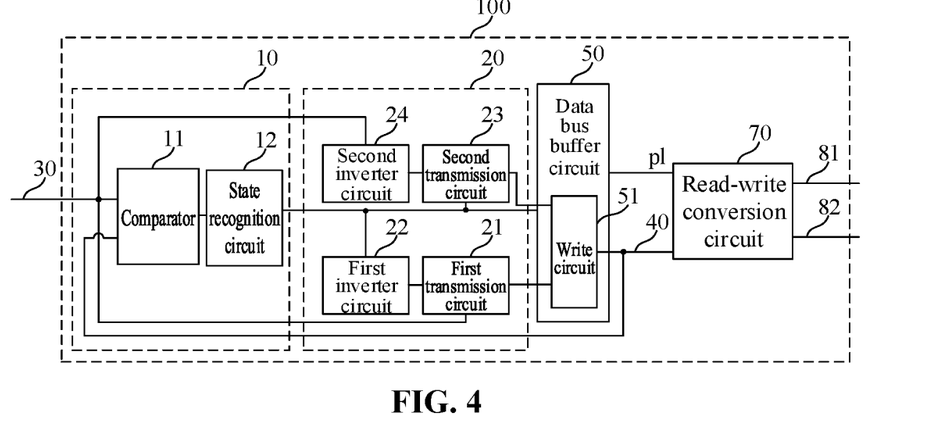
FIG. 4 is a schematic diagram of a principle of a data transmission circuit provided by a fourth embodiment of the present disclosure.

Furthermore, with reference to FIG. 4, in an embodiment of the present disclosure, the data conversion circuit 20 is electrically connected to the read-write conversion circuit 70 through a data bus buffer circuit 50. The data bus buffer circuit 50 is further electrically connected to the state recognition circuit 12 and is configured to generate a data polarity identification signal according to the comparison result. The data bus buffer circuit 50 includes a write circuit 51; and the write circuit 51 is configured to transmit the first data to the global data line 40, or invert the first data and transmit the inverted first data to the global data line 40. The number of inversions of the data is reduced under the premise that the accuracy of the data transmission is ensured, so as to effectively reduce the power consumption in the process of writing the data into the global data line 40 through the data bus 30.

Figure 5:
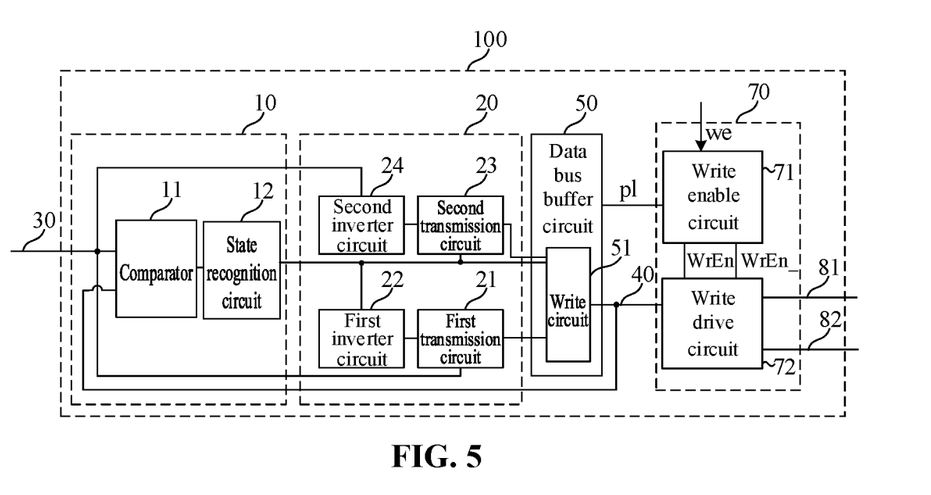
FIG. 5 is a schematic diagram of a principle of a data transmission circuit provided by a fifth embodiment of the present disclosure.

Furthermore, with reference to FIG. 5, in an embodiment of the present disclosure, the read-write conversion circuit 70 includes a write enable circuit 71 and a write drive circuit 72. The write enable circuit 71 is configured to generate a write enable signal WrEn and an inverted write enable signal WrEn_ according to the data polarity identification signal pl and an initial write enable signal we. The write drive circuit 72 is configured to generate third data according to the write enable signal WrEn, the inverted write enable signal WrEn_ and the second data, and transmit the third data to the local data line 81 or the complementary local data line 82, to ensure the accuracy of the data transmission.

Figure 6:
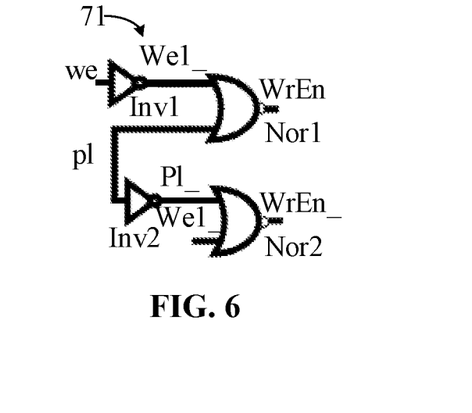
FIG. 6 is a schematic circuit diagram of a write enable circuit in a data transmission circuit provided by an embodiment of the present disclosure.

Furthermore, with reference to FIG. 6, in an embodiment of the present disclosure, the write enable circuit 71 includes a first inverter Inv1, a first NOR gate Nor1, a second inverter Inv2, and a second NOR gate Nor2. The first inverter Inv1 has an input terminal configured to be electrically connected to the initial write enable signal we, and an output terminal configured to output a first inverted write enable signal We1_. The first NOR gate Nor1 has input terminals configured to be electrically connected to the data polarity identification signal pl and the output terminal of the first inverter Inv1, and an output terminal configured to output the write enable signal WrEn. The second inverter Inv2 has an input terminal configured to be electrically connected to the data polarity identification signal pl, and an output terminal configured to output an inverted data polarity identification signal Pl_. The second NOR gate Nor2 has input terminals configured to be electrically connected to the output terminal of the second inverter Inv2 and the output terminal of the first inverter Inv1, and an output terminal configured to output the inverted write enable signal WrEn_. Therefore, the write drive circuit 72 can be controlled, according to the write enable signal WrEn and the inverted write enable signal WrEn_, to generate the third data according to the data on the global data line 40 and transmit the third data to the local data line LIO or the complementary local data line LIO_, so as to implement the recovery of the transmission data, and ensure the accuracy of the data transmission.

Figure 7:
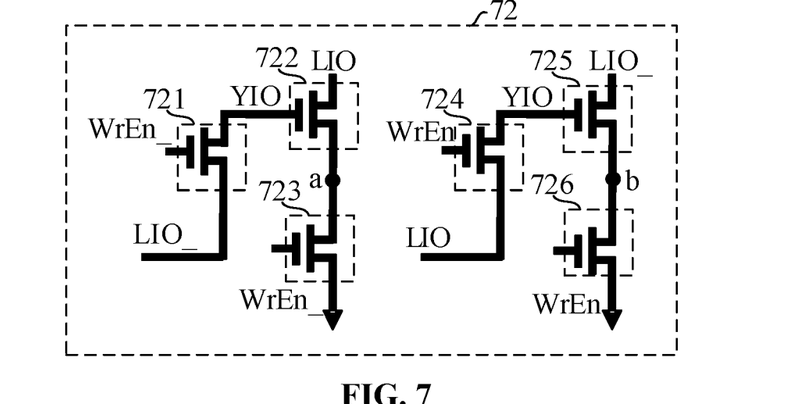
FIG. 7 is a schematic circuit diagram of a write drive circuit in a data transmission circuit provided by an embodiment of the present disclosure.

Furthermore, with reference to FIG. 7, in an embodiment of the present disclosure, the write drive circuit 72 includes a first switch circuit 721, a second switch circuit 722, a third switch circuit 723, a fourth switch circuit 724, a fifth switch circuit 725, and a sixth switch circuit 726. The first switch circuit 721 is configured to be electrically connected to the complementary local data line LIO_ and the global data line YIO according to the inverted write enable signal WrEn_. The second switch circuit 722 has a control terminal configured to be electrically connected to the global data line YIO, a first terminal configured to be electrically connected to the local data line LIO, and a second terminal configured to be electrically connected to a first node a. The third switch circuit 723 is configured to be electrically connected to the first node a and a ground according to the inverted write enable signal WrEn_. The fourth switch circuit 724 is configured to be electrically connected to the local data line LIO and the global data line YIO according to the write enable signal WrEn. The fifth switch circuit 725 has a control terminal configured to be electrically connected to the global data line YIO, a first terminal configured to be electrically connected to the complementary local data line LIO_, and a second terminal configured to be electrically connected to a second node b. The sixth switch circuit 726 is configured to be electrically connected to the second node b and the ground according to the write enable signal WrEn. In this embodiment, the power consumption in the process of writing the data into the local data line LIO or the complementary local data line LIO_ through the data bus Data bus and the global data line YIO is effectively reduced by reducing the number of inversions of the written data in the transmission process, and in particular, the inversions of the data on the global data line YIO are reduced.

Figure 8A:
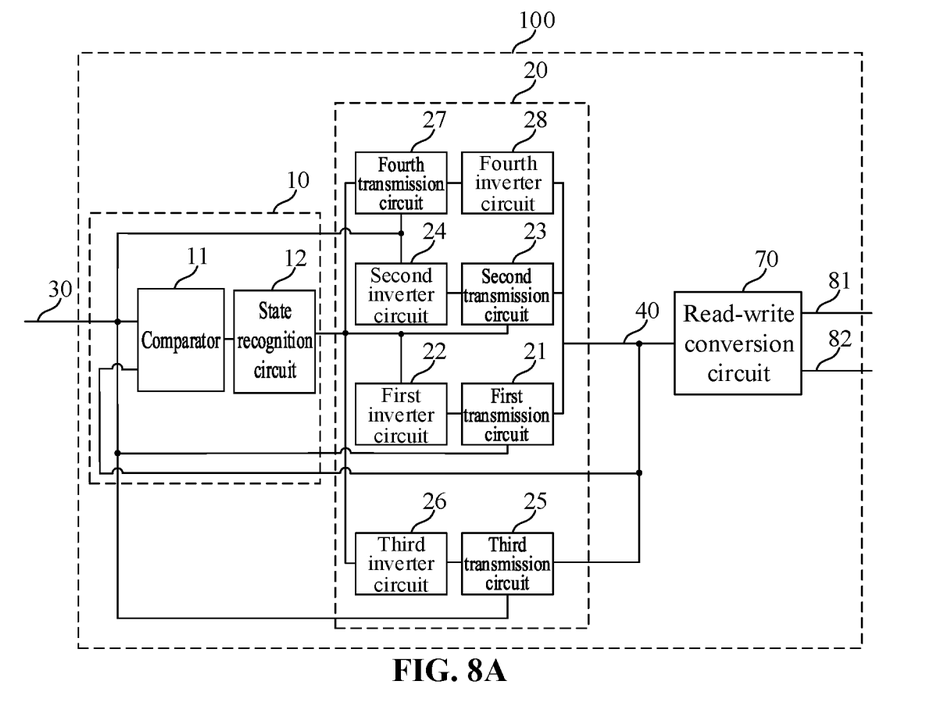
FIG. 8A is a schematic diagram of a principle of a data transmission circuit provided by a sixth embodiment of the present disclosure.
Figure 8B:
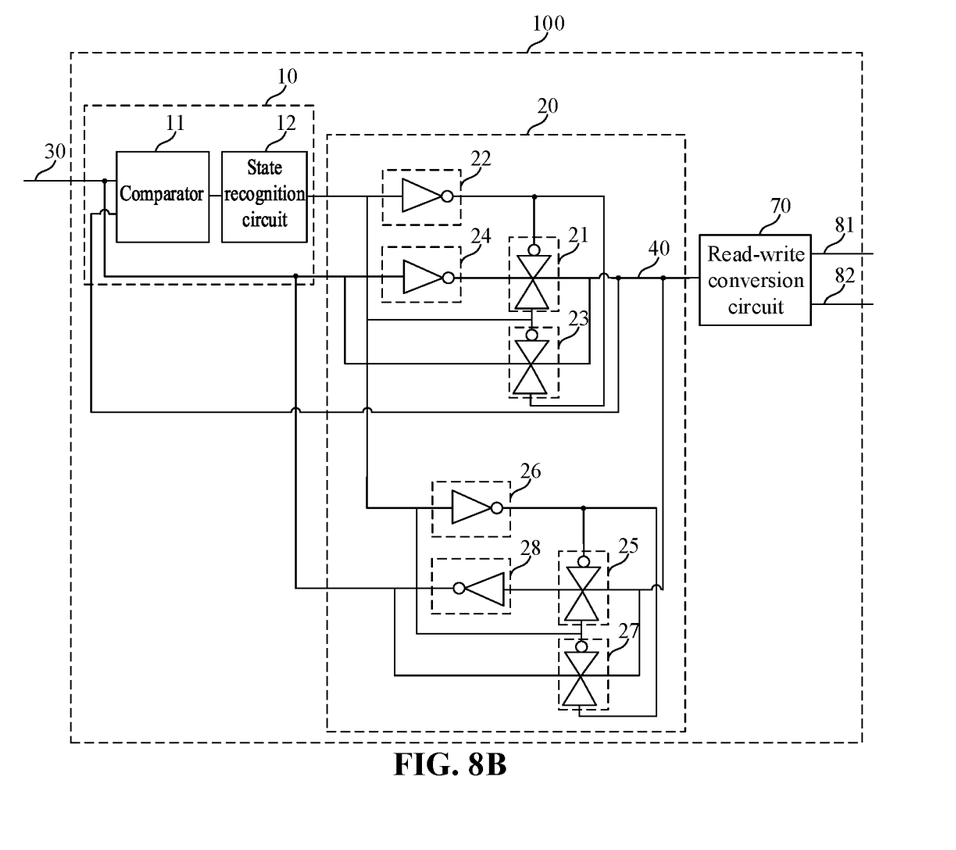
FIG. 8B is a schematic diagram of an implementation of FIG. 8A.

Furthermore, with reference to FIG. 8A and FIG. 8B, in an embodiment of the present disclosure, the data conversion circuit 20 is further configured to invert the second data and transmit the inverted second data to the data bus 30 in a case that the comparison result output by the comparison circuit 10 indicates that the number of different bits exceeds the preset threshold (e.g., half of the preset bit width), and is further configured to transmit the second data to the data bus 30 in a case that the comparison result indicates that the number of different bits does not exceed the preset threshold. For example, during the data reading, in a case that the comparison result output by the comparison circuit 10 indicates that the number of different bits exceeds the preset threshold (e.g., half of the preset bit width), the data conversion circuit 20 inverts the second data provided by the global data line 40 and transmit the inverted second data to the data bus 30; and in a case that the comparison result output by the comparison circuit 10 indicates that the number of different bits does not exceed the preset threshold, the data conversion circuit 20 transmits the second data provided by the global data line 40 to the data bus 30, so as to effectively reduce the power consumption in the process of transmitting the read data to the data bus 30 through the global data line 40.

Figure 9:
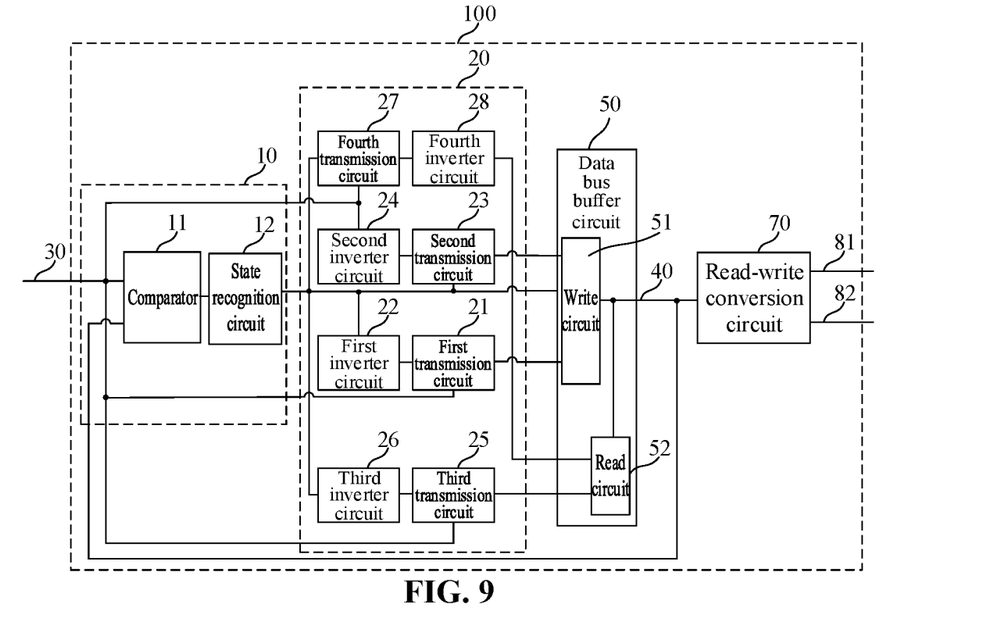
FIG. 9 is a schematic diagram of a principle of a data transmission circuit provided by a seventh embodiment of the present disclosure.

Furthermore, with reference to FIG. 9, in an embodiment of the present disclosure, the data conversion circuit 20 further includes a third transmission circuit 25, a third inverter circuit 26, a fourth transmission circuit 27, and a fourth inverter circuit 28. The third transmission circuit 25 is electrically connected to the data bus 30 and the global data line 40 and is electrically connected to an output terminal of the comparison circuit 10 through the third inverter circuit 26, and is configured to transmit the second data to the data bus 30 in a case that the comparison result output by the comparison circuit 10 indicates that the number of different bits does not exceed the preset threshold. The fourth transmission circuit 27 is electrically connected to the data bus 30 and the output terminal of the comparison circuit 10 and is electrically connected to the global data line 40 through the fourth inverter circuit 28, and is configured to invert the second data and transmit the inverted second data to the data bus 30 in a case that the comparison result output by the comparison circuit 10 indicates that the number of different bits exceeds the preset threshold. In this embodiment, the data on the global data line can be accurately transmitted to the data bus, and the number of inversions of the data during the data transmission can be reduced, so as to effectively reduce the power consumption during transmission of the data through the global data line and the data bus in the process of reading the data.

Figure 10:
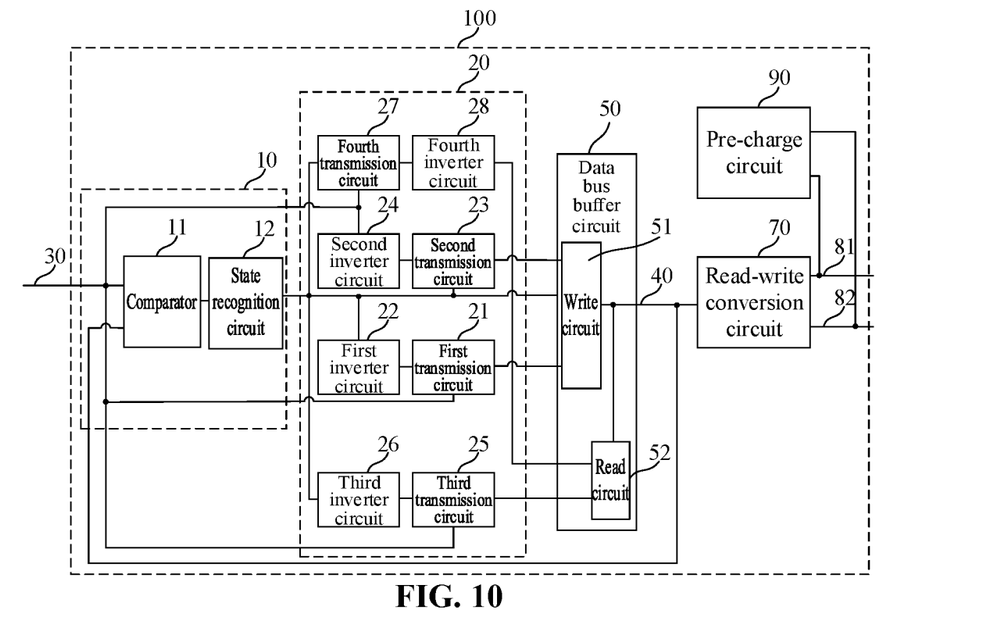
FIG. 10 is a schematic diagram of a principle of a data transmission circuit provided by an eighth embodiment of the present disclosure.

Furthermore, with reference to FIG. 10, in an embodiment of the present disclosure, the data bus buffer circuit 50 further includes a read circuit 52. The read circuit 52 is configured to transmit the second data to the third transmission circuit 25, or invert the second data through the fourth inverter circuit 28 and transmit the inverted second data to the fourth transmission circuit 27. For example, during the data reading, in a case that the comparison result output by the comparison circuit 10 indicates that the number of different bits exceeds the preset threshold (e.g., half of the preset bit width), the fourth transmission circuit 27 inverts the second data provided by the global data line YIO and transmit the inverted second data to the data bus 30; and in a case that the comparison result output by the comparison circuit 10 indicates that the number of different bits does not exceed the preset threshold, the third transmission circuit 25 transmits the second data provided by the global data line 40 to the data bus 30. This embodiment can effectively reduce the power consumption in the process of transmitting the read data to the data bus 30 through the global data line 40.

Furthermore, with continued reference to FIG. 10, in an embodiment of the present disclosure, the data transmission circuit 100 further includes a pre-charge circuit 90. The pre-charge circuit 90 is electrically connected to both the local data line 81 and the complementary local data line 82, and is configured to pre-charge both the local data line 81 and the complementary local data line 82 to a high level before the global data line 40 transmits the data to the local data line 81 or the complementary local data line 82.

Figure 11:
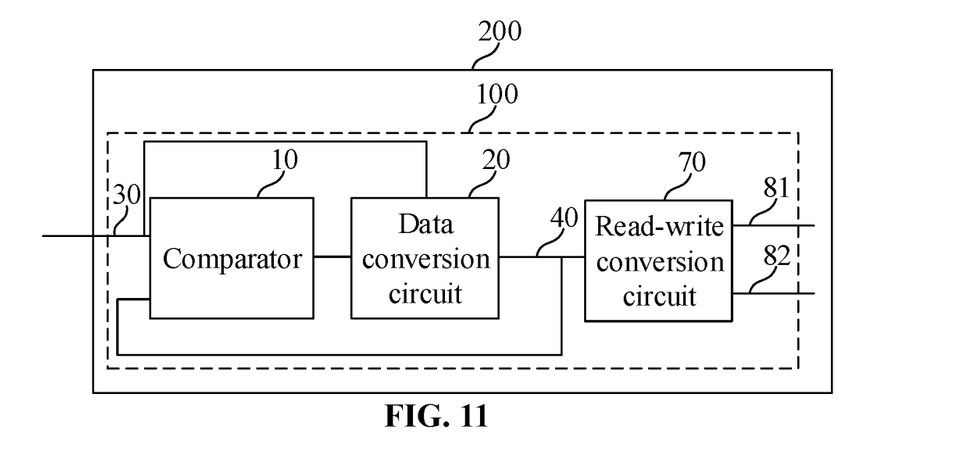
FIG. 11 is a structural block of a storage apparatus provided by an embodiment of the present disclosure.

Furthermore, with reference to FIG. 11, an embodiment of the present disclosure provides a storage apparatus 200. The storage apparatus 200 includes the data transmission circuit 100 of any one of the aforementioned embodiments of the present disclosure, configured to store and transmit data during a read operation or a write operation.

For specific definitions of the storage apparatus 200 in the embodiment, the references can be made to specific definitions of the data transmission circuit 100 in the aforementioned embodiments of the present disclosure, and the details are not repeated herein.

Figure 12:
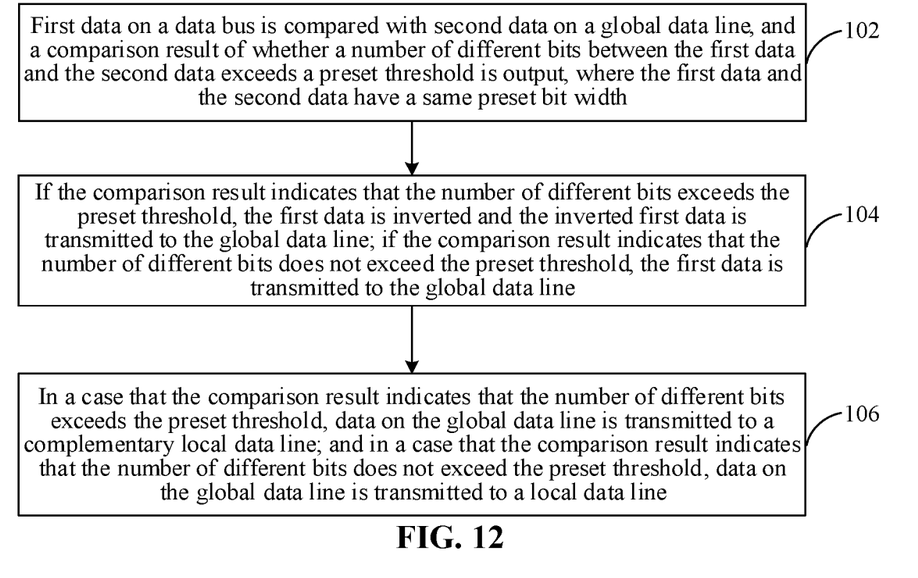
FIG. 12 is a flowchart of a data transmission method provided by an embodiment of the present disclosure.

Furthermore, with reference to FIG. 12, an embodiment of the present disclosure provides a data transmission method. The method includes the following operations.

In operation 102, first data on a data bus is compared with second data on a global data line, and a comparison result of whether a number of different bits between the first data and the second data exceeds a preset threshold is output, where the first data and the second data have a same preset bit width.

In operation 104, if the comparison result indicates that the number of different bits exceeds the preset threshold, the first data is inverted and the inverted first data is transmitted to the global data line; if the comparison result indicates that the number of different bits does not exceed the preset threshold, the first data is transmitted to the global data line.

In operation 106, in a case that the comparison result indicates that the number of different bits exceeds the preset threshold, data on the global data line is transmitted to a complementary local data line; and in a case that the comparison result indicates that the number of different bits does not exceed the preset threshold, data on the global data line is transmitted to a local data line.

In an embodiment, the local data line transmits a signal having a phase which is opposite to a phase of a signal transmitted by the complementary local data line.

Specifically, with continued reference to FIG. 12, the first data on the data bus is compared with the second data on the global data line and the comparison result of whether the number of different bits between the first data and the second data exceeds the preset threshold is output, where the first data and the second data have the same preset bit width. In a case that the comparison result indicates that the number of different bits exceeds the preset threshold, the first data is inverted and the inverted first data is transmitted to the global data line; in a case that the comparison result indicates that the number of different bits does not exceed the preset threshold, the first data is transmitted to the global data line. In a case that the comparison result indicates that the number of different bits exceeds the preset threshold, the second data is inverted and the inverted second data is transmitted to the data bus; in a case that the comparison result indicates that the number of different bits does not exceed the preset threshold, the second data is transmitted to the data bus. Since the transmitted data generally includes a data string consisting of 0 and 1, by applying a power saving algorithm to the transmission process of the data through the data bus, the global data line and the local data line, or through the data bus, the global data line and the complementary local data line, under the premise that the accuracy of the data transmission is ensured, the number of inversions of the data is reduce to effectively reduce the power consumption during the transmission of the data through the data bus, the global data line and the local data line, or through the data bus, the global data line and the complementary local data line. Therefore, the energy consumption of the semiconductor storage apparatus is reduced in a case of ensuring that the density and number of the storage cells in the storage cell array are not reduced. Since the data transmitted by the local data line and the complementary local data line can be used as references to each other, the accuracy of data transmission to the rear-stage circuit is improved while ensuring the efficiency of the data transmission.

Figure 13:
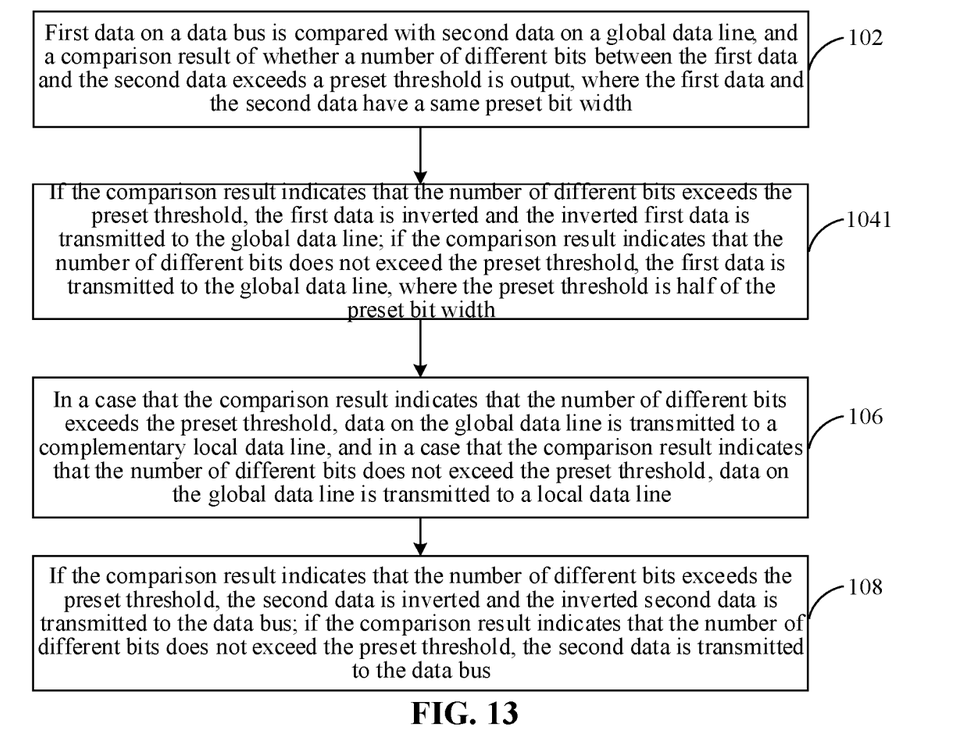
FIG. 13 is a flowchart of a data transmission method provided by another embodiment of the present disclosure.

Furthermore, with reference to FIG. 13, in an embodiment of the present disclosure, the method includes the following operations.

In operation 102, first data on a data bus is compared with second data on a global data line, and a comparison result of whether a number of different bits between the first data and the second data exceeds a preset threshold is output, where the first data and the second data have a same preset bit width.

In operation 1041, if the comparison result indicates that the number of different bits exceeds the preset threshold, the first data is inverted and the inverted first data is transmitted to the global data line; if the comparison result indicates that the number of different bits does not exceed the preset threshold, the first data is transmitted to the global data line, where the preset threshold is half of the preset bit width.

In operation 106, in a case that the comparison result indicates that the number of different bits exceeds the preset threshold, data on the global data line is transmitted to a complementary local data line, and in a case that the comparison result indicates that the number of different bits does not exceed the preset threshold, data on the global data line is transmitted to a local data line.

In operation 108, if the comparison result indicates that the number of different bits exceeds the preset threshold, the second data is inverted and the inverted second data is transmitted to the data bus; if the comparison result indicates that the number of different bits does not exceed the preset threshold, the second data is transmitted to the data bus.

As an example, with continued reference to FIG. 10 and FIG. 13, during the data writing, in a case that the comparison result output by the comparison circuit 10 indicates that the number of different bits exceeds the preset threshold (e.g., half of the preset bit width), the second transmission circuit 23 inverts the first data and transmit the inverted first data to the global data line 40; and in a case that the comparison result output by the comparison circuit 10 indicates that the number of different bits does not exceed the preset threshold, the first transmission circuit 21 transmits the first data to the global data line 40, so as to effectively reduce the power consumption in the process of transmitting the written data to the global data line 40 through the data bus 30. During the data reading, in a case that the comparison result output by the comparison circuit 10 indicates that the number of different bits exceeds the preset threshold, the fourth transmission circuit 27 inverts the second data provided by the global data line 40 and transmit the inverted second data to the data bus 30; and in a case that the comparison result output by the comparison circuit 10 indicates that the number of different bits does not exceed the preset threshold, the third transmission circuit 25 transmits the second data provided by the global data line 40 to the data bus 30. This embodiment can effectively reduce the power consumption in the process of transmitting the read data to the data bus 30 through the global data line 40.

An embodiment of the present disclosure provides a computer-readable storage medium, having a computer program stored thereon that, when executed by a processor, cause the processor to perform the data transmission method of any one of the embodiments of the present disclosure.

It is to be understood that although the operations in the flowcharts in FIG. 12 and FIG. 13 are displayed in sequence according to arrows, the operations are not necessarily performed in the sequence indicated by the arrows. Unless otherwise explicitly specified in the present disclosure, execution of the operations is not strictly limited, and the operations may be performed in other sequences. Moreover, at least a part of the operations in FIG. 12 and FIG. 13 may include a plurality of operations or a plurality of stages. These operations or stages are not necessarily completed at the same moment, but may be performed at different moments. The execution sequence of these operations or stages may not be necessarily performed sequentially, but may be performed in turn or alternately with other operations or at least a part of operations or stages among other operations.

A person of ordinary skill in the art may understand that all or some of the procedures of the methods in the foregoing embodiments may be implemented by computer programs instructing relevant hardware. The computer programs may be stored in a non-transitory computer-readable storage medium. When the computer programs are executed, the procedures of the embodiments of the foregoing methods may be included. References to the memory, the storage, the database, or other media used in the embodiments provided in the present disclosure may all include a non-volatile or a volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache. By way of description rather than limitation, the RAM may be obtained in a plurality of forms, such as a static RAM (SRAM), a dynamic RAM (DRAM), a synchronous DRAM (SDRAM), a double data rate SDRAM (DDRSDRAM), an enhanced SDRAM (ESDRAM), a Synchlink DRAM (SLDRAM), a direct Rambus dynamic RAM (DRDRAM), and a Rambus dynamic RAM (RDRAM).

It is noted that the foregoing embodiments are merely used for the purpose of explanations without the meaning of limiting the present disclosure.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope described in the present disclosure.

The foregoing embodiments show only several implementations of the present disclosure and are described in detail, which, however, are not to be construed as a limitation to the patent scope of the present disclosure. For a person of ordinary skill in the art, several transformations and improvements can be made without departing from the idea of the present disclosure. These transformations and improvements belong to the protection scope of the present disclosure. Therefore, the protection scope of the present disclosure shall be subject to the appended claims.

What is claimed is:

1. A data transmission circuit, comprising:
   a comparison circuit, configured to receive first data on a data bus and second data on a global data line, and compare the first data with the second data to output a comparison result of whether a number of different bits between the first data and the second data exceeds a preset threshold, wherein the first data and the second data have a same preset bit width;
   a data conversion circuit, electrically connected to the data bus, the comparison circuit and the global data line, and configured to: invert the first data and transmit the inverted first data to the global data line in response to the comparison result indicating that the number of different bits exceeds the preset threshold, and transmit the first data to the global data line in response to the comparison result indicating that the number of different bits does not exceed the preset threshold; and
   a read-write conversion circuit, electrically connected to the global data line, a local data line and a complementary local data line, and configured to: transmit data on the global data line to the complementary local data line in response to the comparison result indicating that the number of different bits exceeds the preset threshold, and transmit data on the global data line to the local data line in response to the comparison result indicating that the number of different bits does not exceed the preset threshold.

2. The data transmission circuit of claim 1, wherein the read-write conversion circuit is configured to:
   in response to the comparison result indicating that the number of different bits exceeds the preset threshold, pull down the local data line to a low level when the global data line is at a high level; and
   in response to the comparison result indicating that the number of different bits does not exceed the preset threshold, pull down the complementary local data line to the low level when the global data line is at the high level.

3. The data transmission circuit of claim 1, wherein the preset threshold is half of the preset bit width; and the comparison circuit comprises:
   a comparator, configured to compare the first data with the second data bit by bit and output comparison state data of respective bits; and
   a state recognition circuit, electrically connected to the comparator, and configured to perform statistics on the comparison state data of the respective bits and output the comparison result according to a statistical result.

4. The data transmission circuit of claim 3, wherein the data conversion circuit comprises:
   a first transmission circuit, electrically connected to the data bus and the global data line and electrically connected to an output terminal of the state recognition circuit through a first inverter circuit, and configured to transmit the first data to the global data line in response to the comparison result indicating that the number of different bits does not exceed the preset threshold; and
   a second transmission circuit, electrically connected to the global data line and the output terminal of the state recognition circuit and electrically connected to the data bus through a second inverter circuit, and configured to invert the first data and transmit the inverted first data to the global data line in response to the comparison result indicating that the number of different bits exceeds the preset threshold.

5. The data transmission circuit of claim 4, wherein the data conversion circuit is electrically connected to the read-write conversion circuit through a data bus buffer circuit; and
   the data bus buffer circuit is further electrically connected to the state recognition circuit, and configured to generate a data polarity identification signal according to the comparison result;
   wherein the data bus buffer circuit comprises a write circuit, configured to transmit the first data to the global data line, or configured to invert the first data and transmit the inverted first data to the global data line.

6. The data transmission circuit of claim 5, wherein the read-write conversion circuit comprises:
   a write enable circuit, configured to generate a write enable signal and an inverted write enable signal according to the data polarity identification signal and an initial write enable signal; and
   a write drive circuit, configured to generate third data according to the write enable signal, the inverted write enable signal and the second data, and transmit the third data to the local data line or the complementary local data line.

7. The data transmission circuit of claim 6, wherein the write enable circuit comprises:

a first inverter, having an input terminal configured to be electrically connected to the initial write enable signal, and an output terminal configured to output a first inverted write enable signal;

a first NOR gate, having input terminals configured to be electrically connected to the data polarity identification signal and the output terminal of the first inverter, and an output terminal configured to output the write enable signal;

a second inverter, having an input terminal configured to be electrically connected to the data polarity identification signal, and an output terminal configured to output an inverted data polarity identification signal; and a second NOR gate, having input terminals configured to be electrically connected to the output terminal of the second inverter and the output terminal of the first inverter, and having an output terminal configured to output the inverted write enable signal.

8. The data transmission circuit of claim 7, wherein the write drive circuit comprises:

a first switch circuit, configured to be electrically connected to the complementary local data line and the global data line according to the inverted write enable signal;

a second switch circuit, having a control terminal configured to be electrically connected to the global data line, a first terminal configured to be electrically connected to the local data line, and a second terminal configured to be electrically connected to a first node;

a third switch circuit, configured to be electrically connected to the first node and a ground according to the inverted write enable signal;

a fourth switch circuit, configured to be electrically connected to the local data line and the global data line according to the write enable signal;

a fifth switch circuit, having a control terminal configured to be electrically connected to the global data line, a first terminal configured to be electrically connected to the complementary local data line, and a second terminal configured to be electrically connected to a second node; and a sixth switch circuit, configured to be electrically connected to the second node and the ground according to the write enable signal.

9. The data transmission circuit of claim 1, wherein the data conversion circuit is further configured to: invert the second data and transmit the inverted second data to the data bus in response to the comparison result indicating that the number of different bits exceeds the preset threshold, and transmit the second data to the data bus in response to the comparison result indicating that the number of different bits does not exceed the preset threshold.

10. The data transmission circuit of claim 9, wherein the data conversion circuit comprises:

a third transmission circuit, electrically connected to the data bus and the global data line and electrically connected to an output terminal of the comparison circuit through a third inverter circuit, and configured to transmit the second data to the data bus in response to the comparison result indicating that the number of different bits does not exceed the preset threshold; and a fourth transmission circuit, electrically connected to the data bus and the output terminal of the comparison circuit and electrically connected to the global data line through a fourth inverter circuit, and configured to invert the second data and transmit the inverted second data to the data bus in response to the comparison result indicating that the number of bits exceeds the preset threshold.

11. The data transmission circuit of claim 10, wherein the data conversion circuit is electrically connected to the read-write conversion circuit through a data bus buffer circuit, and the data bus buffer circuit comprises:

a read circuit, configured to transmit the second data to the third transmission circuit, or invert the second data through the fourth inverter and transmit the inverted second data to the fourth transmission circuit.

12. The data transmission circuit of claim 1, further comprising:

a pre-charge circuit, electrically connected to both the local data line and the complementary local data line, and configured to pre-charge both the local data line and the complementary local data line to a high level before the global data line transmits the data to the local data line or the complementary local data line.

13. A storage apparatus, comprising:

the data transmission circuit according to claim 1, configured to store and transmit data during a read operation or a write operation.

14. A data transmission method, comprising:

comparing first data on a data bus with second data on a global data line, and outputting a comparison result of whether a number of different bits between the first data and the second data exceeds a preset threshold, wherein the first data and the second data have a same preset bit width;

in response to the comparison result indicating that the number of different bits exceeds the preset threshold, inverting the first data and transmitting the inverted first data to the global data line; in response to the comparison result indicating that the number of different bits does not exceed the preset threshold, transmitting the first data to the global data line; and in response to the comparison result indicating that the number of different bits exceeds the preset threshold, transmitting data on the global data line to a complementary local data line; and in response to the comparison result indicating that the number of different bits does not exceed the preset threshold, transmitting data on the global data line to a local data line, wherein the local data line transmits a signal having a phase which is opposite to a phase of a signal transmitted by the complementary local data line.

15. The data transmission method of claim 14, wherein the preset threshold is half of the preset bit width, and the method further comprises:

in response to the comparison result indicating that the number of different bits exceeds the preset threshold, inverting the second data and transmitting the inverted second data to the data bus; in response to the comparison result indicating that the number of different bits does not exceed the preset threshold, transmitting the second data to the data bus.

16. The data transmission method of claim 14, further comprising:

in response to the comparison result indicating that the number of different bits exceeds the preset threshold, pulling down the local data line to a low level when the global data line is at a high level; and in response to the comparison result indicating that the number of different bits does not exceed the preset threshold, pulling down the complementary local data line to the low level when the global data line is at the high level.

17. The data transmission method of claim 14, wherein the preset threshold is half of the preset bit width; and
comparing the first data on the data bus with the second data on the global data line and outputting the comparison result of whether the number of different bits between the first data and the second data exceeds the preset threshold comprises:
comparing the first data with the second data bit by bit and outputting comparison state data of respective bits; and
performing statistics on the comparison state data of the respective bits and outputting the comparison result according to a statistical result.

18. The data transmission method of claim 14, further comprising:
pre-charging both the local data line and the complementary local data line to a high level before the global data line transmits the data to the local data line or the complementary local data line.

\* \* \* \* \*